United States Patent
Douglas

(10) Patent No.: US 8,575,945 B2
(45) Date of Patent: Nov. 5, 2013

(54) SUBSEA LINE MONITORING DEVICE

(75) Inventor: Neil Douglas, Somerset (GB)

(73) Assignee: Viper Subsea Limited, Bristol (GB)

( * ) Notice: Subject to any disclaimer, the term of this patent is extended or adjusted under 35 U.S.C. 154(b) by 266 days.

(21) Appl. No.: 12/964,709

(22) Filed: Dec. 9, 2010

(65) Prior Publication Data

US 2011/0298467 A1 Dec. 8, 2011

(30) Foreign Application Priority Data

Dec. 10, 2009 (GB) ................................. 0921632.6
May 25, 2010 (GB) ................................. 1008696.5

(51) Int. Cl.
*G01R 27/04* (2006.01)
*G01R 31/11* (2006.01)
*E21B 29/12* (2006.01)
*E21B 47/10* (2012.01)

(52) U.S. Cl.
USPC ........... 324/642; 324/534; 166/337; 166/340; 166/250.08

(58) Field of Classification Search
USPC ......... 324/509, 500, 642, 522, 523, 525, 527, 324/528, 530, 531, 532, 533, 534, 535, 324/555; 73/49.1, 49.2, 49.3, 49.5, 618, 73/620, 622, 799; 166/336–338, 340, 166/250.01, 250.08; 367/13, 134
See application file for complete search history.

(56) References Cited

U.S. PATENT DOCUMENTS

| | | | | |
|---|---|---|---|---|
| 4,128,011 A * | 12/1978 | Savage | ........................... | 73/579 |
| 4,949,076 A * | 8/1990 | Wann | ........................... | 340/605 |
| 5,157,958 A * | 10/1992 | Geisinger | ........................... | 73/1.02 |
| 5,239,261 A * | 8/1993 | Murdock et al. | ........................... | 324/750.03 |
| 5,455,506 A | 10/1995 | Mimeault et al. | | |
| 5,883,517 A | 3/1999 | Broyde et al. | | |
| 6,085,683 A * | 7/2000 | French et al. | ........................... | 114/258 |
| 6,451,201 B1 * | 9/2002 | Cadera et al. | ........................... | 210/85 |
| 6,937,030 B2 * | 8/2005 | Liney et al. | ........................... | 324/642 |
| 8,430,168 B2 * | 4/2013 | Goodall et al. | ........................... | 166/336 |

FOREIGN PATENT DOCUMENTS

| | | |
|---|---|---|
| BR | PI 0802224 | 2/2010 |
| DE | 3727224 | 2/1989 |
| DE | 4012969 | 10/1991 |
| EP | 0 077 757 | 4/1983 |
| EP | 0 460 315 | 12/1991 |
| EP | 1 738 855 | 1/2007 |
| JP | 58-066873 | 4/1983 |
| JP | 2003-284236 | 10/2003 |
| JP | 2005-062124 | 3/2005 |
| JP | 2006-292519 | 10/2006 |

(Continued)

OTHER PUBLICATIONS

United Kingdom Intellectual Property Office, Search Report, Application No. GB 0921632.6, Apr. 29, 2010, two pages.

(Continued)

*Primary Examiner* — Hoai-An D Nguyen
(74) *Attorney, Agent, or Firm* — Fenwick & West

(57) ABSTRACT

A subsea line monitoring device includes a diagnostic unit adapted to be deployed, in use, in a subsea location and having a first connector, the diagnostic unit being operable, in use, to output a signal indicative of the integrity of a line or device connected to the first connector. The subsea line monitoring device may be deployed on a long term or permanent basis at the subsea location.

16 Claims, 4 Drawing Sheets

(56) References Cited

FOREIGN PATENT DOCUMENTS

| KR | 2010-0046750 | 5/2010 |
|----|--------------|--------|
| KR | 10-0983561 | 9/2010 |
| SU | 447650 | 10/1974 |

OTHER PUBLICATIONS

United Kingdom Intellectual Property Office, Search Report, Application No. GB 1020511.0, Jan. 13, 2011, two pages.

* cited by examiner

SUBSEA LINE MONITORING DEVICE

CROSS REFERENCE TO RELATED APPLICATIONS

This application claims the right of priority based on UK application Ser. No. 1008696.5, filed May 25, 2010, and on UK application Ser. No. 0921632.6, filed Dec. 10, 2009, each of which is incorporated by reference in its entirety.

BACKGROUND

This invention relates to a subsea deployed line monitoring device for monitoring the integrity of lines, for example electrical cables, used in subsea environments. The invention is particularly applicable to monitoring the integrity of umbilicals, subsea cables and electrical distribution equipment used in controlling, powering and/or monitoring the operation of subsea located equipment such as that used in the extraction of oil or natural gas. However, it may also be used in other applications, such as with equipment used in the off-shore generation of electricity.

Where fluids are extracted from subsea wells it is usual to use control equipment, often located on the sea bed, to control for example, the pumping of fluids to the surface or to control a number of other functions. The control equipment is usually connected to a remote facility, for example at the surface or on land, by way of an umbilical through which electrical power and control signals are routed. The umbilical may also include optical fibres, hydraulic hoses or the like.

Where several control equipment devices are used, as is normally the case, a single umbilical is usually connected between the remote facility and a subsea distribution unit or node, separate cables connecting the distribution unit and the devices to distribute electrical power and control signals there between.

The subsea environment is harsh with respect to electrical circuits of the control equipment devices. When electrical failures occur in the subsea cables and/or connectors it is often difficult to diagnose the cause of the fault, or the fault location.

The most common failure arising from the subsea environment is the failure of insulation as a result of water ingress. Such a failure may result in short circuits between conductors and/or current flow from the live conductor or conductors to earth.

It is common for the umbilical, distribution unit and connecting cables to incorporate a degree of redundancy so that if a fault occurs in one channel of the system, operation can be switched to take that channel out of service.

Usually, surface located equipment is used to monitor the insulation resistance of the umbilical and thereby provide an indication of the status of the umbilical. However, where a transformer or other form of Galvanic isolator is provided, the surface located equipment cannot monitor the insulation resistance or other faults to the other side of the Galvanic isolator.

Some pieces of subsea equipment are provided with line monitoring devices whereby the lines connecting the equipment to, for example, a distribution unit or node, can be monitored. However most subsea equipment currently in use does not have this functionality. Consequently, identification of faults and determination of the location of faults relies heavily on subsea intervention and so is often a time-consuming and expensive process.

SUMMARY

It is an object of the invention to provide a subsea deployed line monitoring device whereby detection of the integrity of lines in subsea locations can be simplified.

According to the present invention there is provided a subsea line monitoring device comprising a diagnostic unit adapted for deployment in a subsea location and having a first connector, the diagnostic unit being operable, in use, to output a signal indicative of the integrity of a line or device connected to the first connector.

The monitoring device can advantageously be operated in such a manner as to allow continued operation of the line or device to which the monitoring device is connected whilst the diagnostic unit monitors the integrity thereof.

Conveniently, the diagnostic unit is additionally provided with at least a second connector, and is preferably operable to output a signal indicative of the integrity of a line or device connected to the second connector.

In use, the subsea line monitoring device may be deployed or installed, temporarily, between, for example, a subsea line connected to a subsea located device and a distribution unit, and may be operable to output separate signals indicative of the integrity of the subsea line and device and of the distribution unit, and of the associated connectors. Although reference is made herein to the temporary deployment of the device, it will be appreciated that there may be applications in which it is desirable for the device to be installed on a long term or permanent basis. For example it may be installed as a permanent retro-fit to an existing subsea installation.

Preferably, the first and second connectors are electrically interconnected so as to permit the transmission of power and/or signals therebetween. Such an arrangement is advantageous in that integrity can be monitored whilst the subsea device is in use, if desired.

Preferably, the diagnostic unit is provided with an internal power supply, for example in the form of a re-chargeable battery.

The diagnostic unit may include a display whereby the output signal can be output. Alternatively or additionally it may be transmitted to a remote location. Further, it may be stored within a memory for subsequent use upon removal of the device from the test location.

The diagnostic unit may be operable to sense the presence of an earth leakage or line insulation resistance fault. Alternatively, or additionally, it may allow the sensing of one or more other electrical parameters such as impedance, voltage, current and/or power. Time Domain Reflectometry (TDR) functionality may be incorporated in order to help identify the precise location of the sensed fault, and may be used in conjunction with the aforementioned techniques, if desired.

Although the description herein is primarily related to subsea distribution architectures, it will be appreciated that the invention is also applicable to other subsea installations. For example, it may be used in monitoring the integrity of lines secured to the exterior of pipes, or may be used in off-shore electrical generation applications. Furthermore, it may be used in monitoring the operation of downhole instrumentation equipment.

BRIEF DESCRIPTION OF THE DRAWINGS

The invention will further be described, by way of example, with reference to the accompanying drawings, in which.

DETAILED DESCRIPTION

Figure 1:
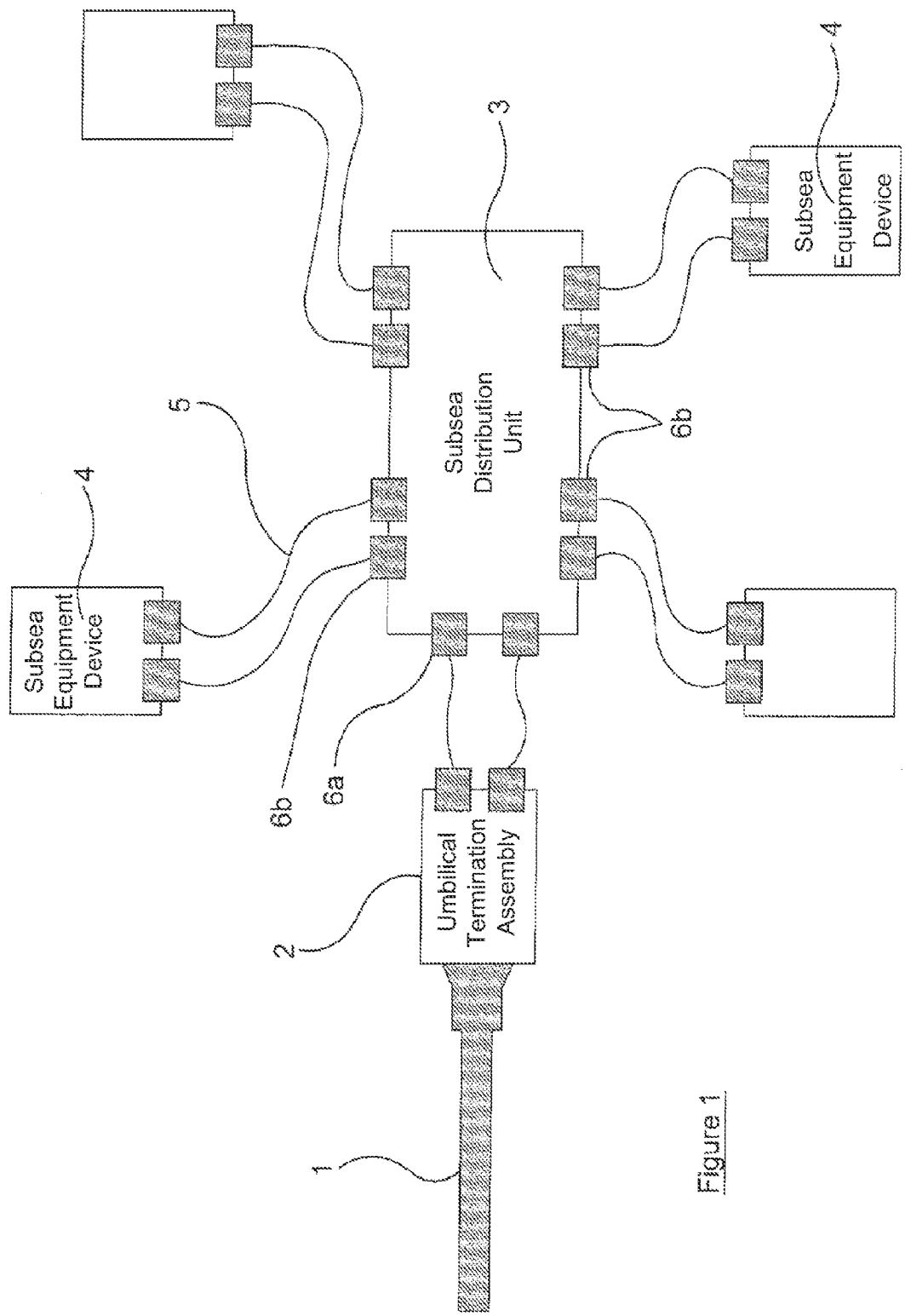
FIG. 1 is a diagrammatic view illustrating a typical subsea installation.

Referring firstly to FIG. 1 there is illustrated part of a typical subsea installation which comprises a subsea distribution unit 3 operable to distribute power and control signals from a remote location, for example via an umbilical 1 and umbilical termination assembly 2 to a series of subsea equipment devices 4. Electrical input connectors 6a and output connectors 6b are provided to allow the distribution unit 3, umbilical termination assembly 2 and devices 4 to be connected to one another using a series of subsea cables or jumpers 5. The cables 5 are used to transfer electrical power, and they also conduct control signals.

The distribution unit 3 may be provided with electrical protection circuitry to isolate any electrical short circuits arising, for example, as a result of the breakdown of the insulation of one or more of the cables 5 or a failure within one or more of the output connectors 6b. It may also incorporate a transformer to step down high voltage transmissions from the surface and umbilical 1 to lower voltages that are better suited for use by the devices 4.

As mentioned hereinbefore, a common failure in subsea electrical equipment, connectors and cables is the loss of insulation resistance as a result of partial or full failure of barriers to sea water. The ingress of sea water may not directly manifest itself as an over current condition but, over time, degradation of the integrity of the system is likely to take place resulting, ultimately, in an over current condition. Where there are several devices 4 connected to a single umbilical 1 as in the arrangement illustrated, then it is normal to monitor the subsea insulation resistance from the surface. Whilst such monitoring may detect the presence of a fault, it cannot identify the location of the fault and so diagnosis of the precise nature and location of the fault and remedy thereof is typically a time-consuming and expensive exercise. A 'subsea megger' device can be used in some circumstances in order to detect the presence or location of a fault. However, such a device requires disconnection of the devices to be tested, and the application of a high voltage thereto to detect the electrical integrity thereof. The use of such a 'megger' device is therefore inconvenient as the devices need to be disconnected and, in some circumstances, there may be a risk of damage thereto resulting from the application of high voltages thereto. It cannot be used whilst use of the devices being tested in ongoing.

Figure 2:
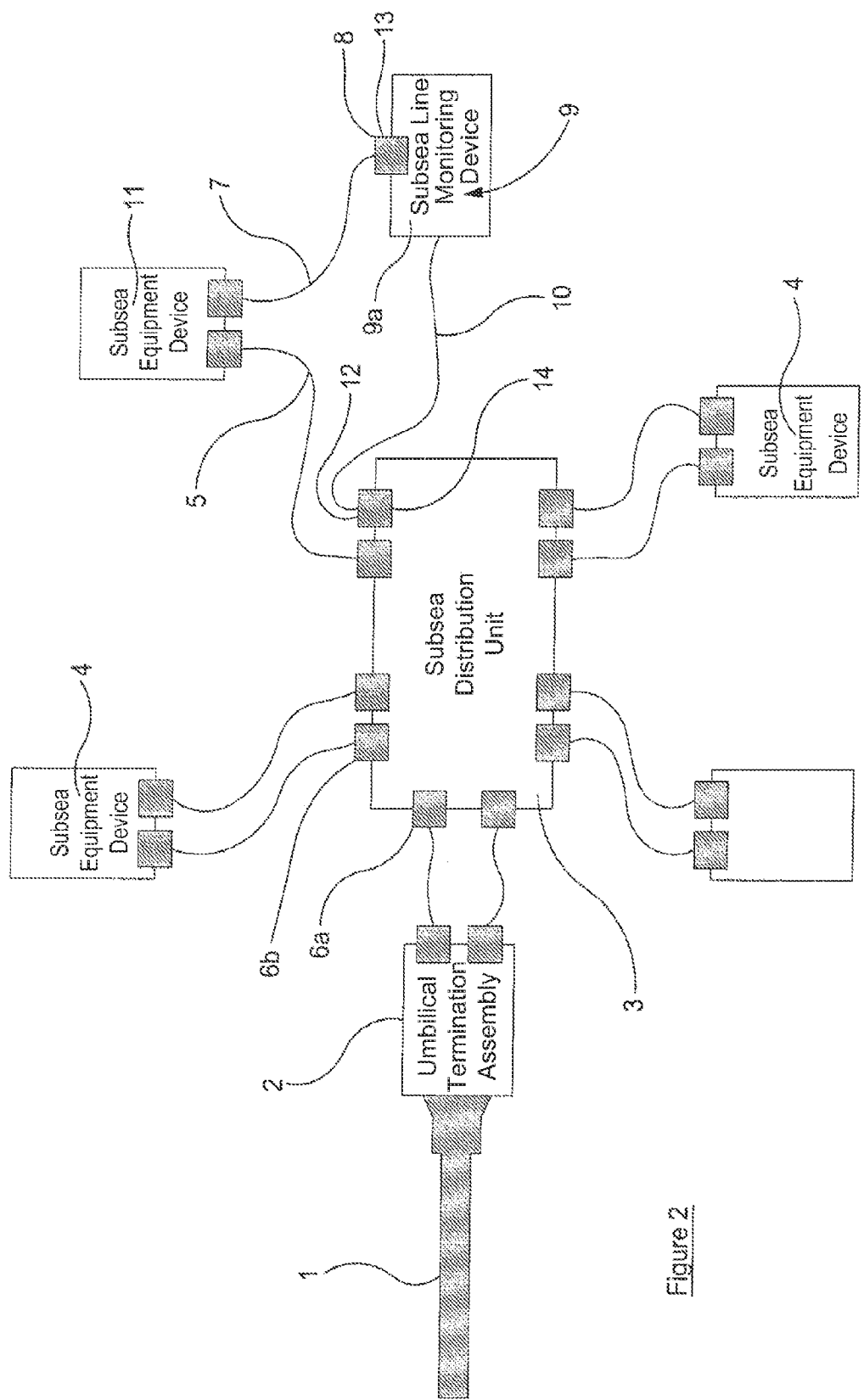
FIG. 2 is a view similar to FIG. 1, illustrating the use of the device of an embodiment of the invention.
Figure 3:
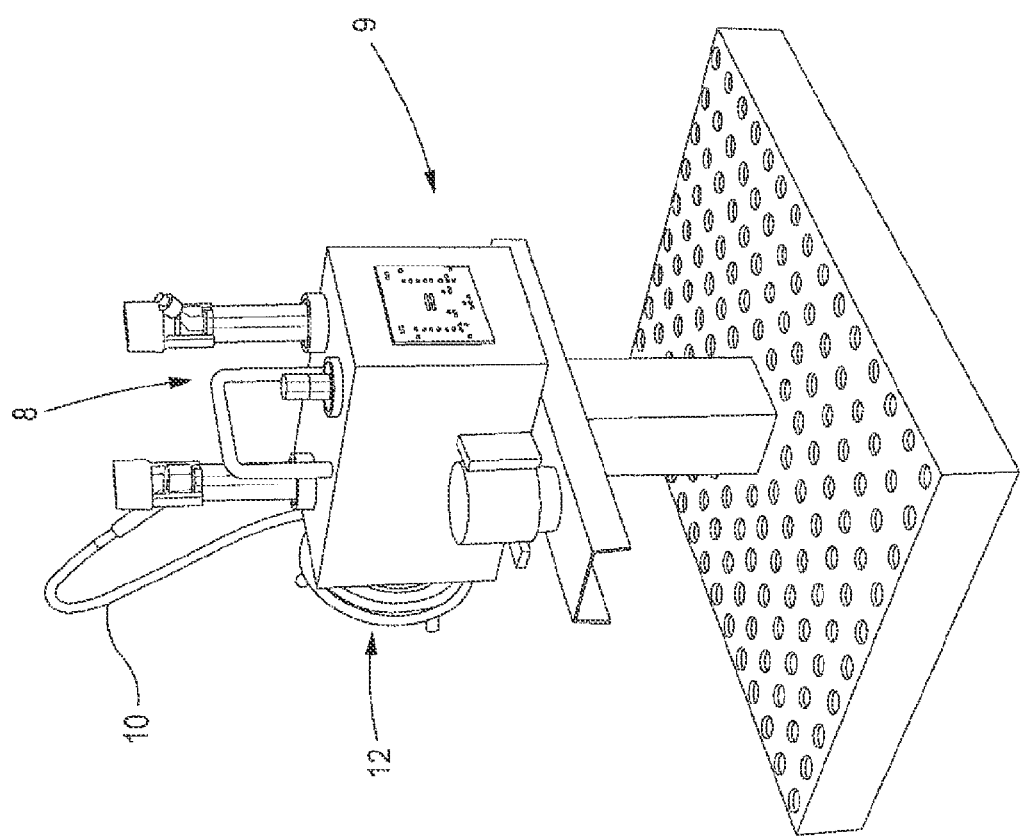
FIG. 3 illustrates one embodiment of the invention.
Figure 4:
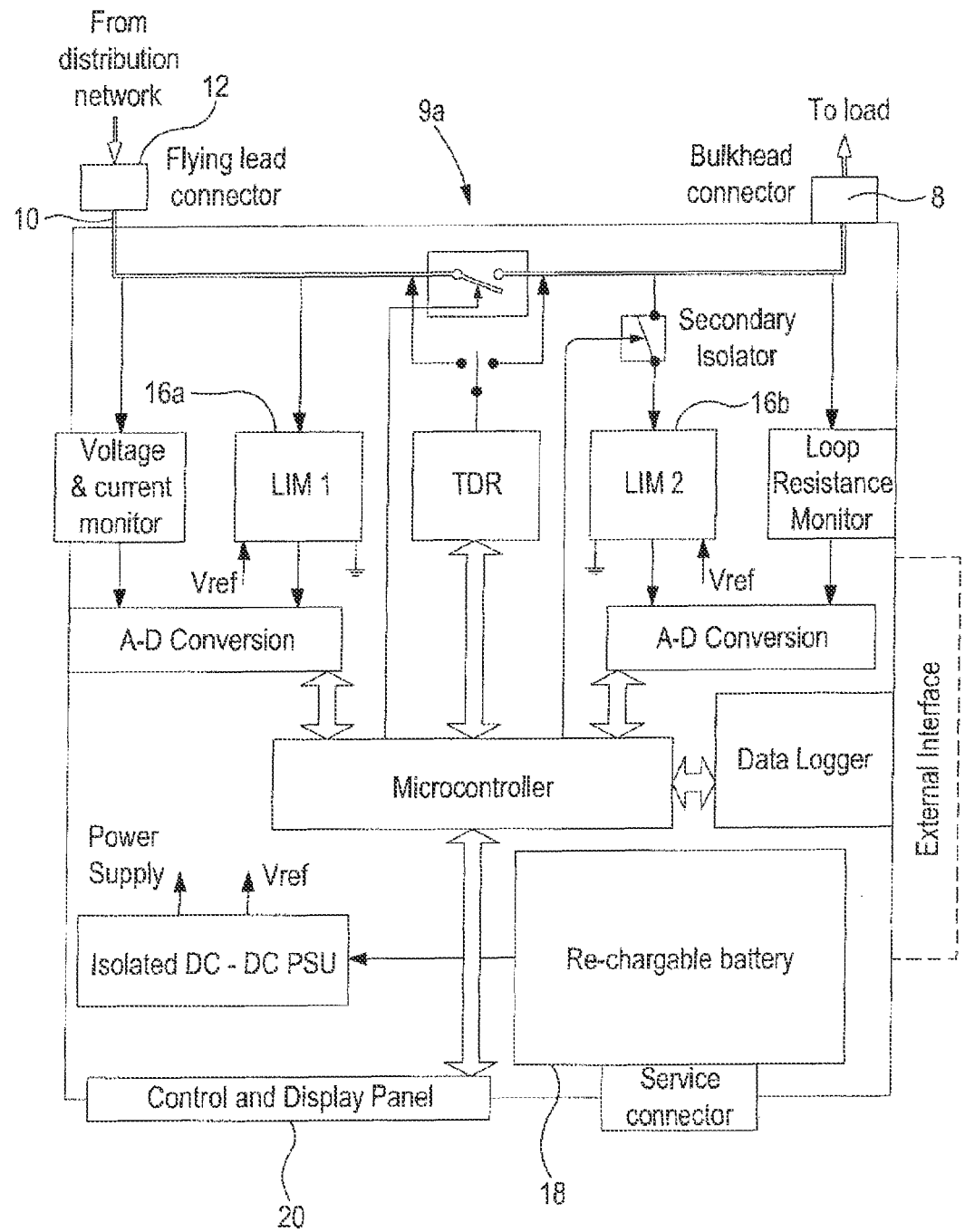
FIG. 4 is a block diagram illustrating the operation of the embodiment of FIGS. 2 and 3.

In accordance with one embodiment of the invention and as illustrated in FIGS. 2 to 4, a subsea line monitoring device 9 may be provided to assist in the diagnosis of faults in subsea locations. The line monitoring device 9 comprises a diagnostic unit 9a and first and second connectors 8, 12. In the arrangement illustrated, the connector 8 is secured directly to a housing of the diagnostic unit 9a whilst the connector 12 is mounted to an end of a cable 10 which, in turn, is connected to the diagnostic unit 9a. The nature of the connectors 8, 12 is such that the connector 12 can be connected directly to one of the connectors (denoted by numeral 14 in FIG. 2) of the subsea distribution unit 3 and the connector 8 can be directly connected to one of the connectors (denoted by numeral 13 in FIG. 2) provided at an end of one of the cables (denoted by numeral 7 in FIG. 2). It will be appreciated that in the absence of the line monitoring device 9, the connector 13 and connector 14 would be directly connected to one another. The presence of the line monitoring device 9 between the connectors 13, 14 permits monitoring of the integrity of the cable 7, the connector 13 and device 11 to which the cable 7 is connected, and also permits monitoring, independently, of the integrity of the connector 14, distribution unit 3 and components located upstream thereof.

The line monitoring device 9 is thus designed for installation or deployment in a subsea location, and is designed in such a manner as to be able to withstand deployment in such a harsh environment.

In use, when a fault in the form of low line insulation resistance is measured from the surface, the subsea line insulation monitoring device 9 is deployed on a temporary basis to the sea bed in close proximity to the connectors and cables to be tested. For example, it may be installed by a diver or using a remotely operated vehicle (ROV). As illustrated, one of the connectors associated with the cable to be checked is disconnected from the electrical distribution 3 and connected instead to the device 9. The connector 12 provided on the cable 10 of the device 9 is connected to the vacant connector 14 provided on the subsea distribution unit 3. Once the connections have been made in this manner, the subsea line insulation monitoring device 9 can check for any earth leakage faults. The insulation resistance checks can be undertaken at low voltage levels, typically no higher than the normal working voltages of the subsea electrical connectors and cables. Consequently, the testing operation will not result in any damage occurring as a result of the exposure of components to higher voltages as may occur when testing. The result of the testing can be displayed locally on the device 9 via a suitable display. Alternatively, or additionally, the results may be stored locally in a memory device provided in the diagnostic unit 9a for subsequent analysis after recovery of the device 9. A further alternative is that the results of the test may be transmitted to a remote location, for example via a hard wired connection (either of electrical or optical cable form), acoustic communications link or electro-magnetic communications link. In such an arrangement, the remote location would typically be in the form of a host platform, a surface located vessel or an ROV.

If the result of the test indicates that a fault exists or that the electrical integrity of the tested component or components is marginal, then the subsea line insulation monitoring device 9 can identify whether the fault is in the connector 14 or upstream of that connector for example within the subsea distribution unit 3 umbilical termination unit 2 or umbilical 1. Similarly, the device can identify whether the fault is within the electrical connector 13, cable 7 or downstream thereof in the device 11. In either case, upon determining the location of the fault, appropriate remedial action to replace the failed component or rely upon appropriate redundancy to avoid the continued use of that component can be undertaken.

If necessary, the device 9 can be temporarily installed in a range of positions to allow testing of all or a large part of the subsea installation.

In addition to identifying whether or not an earth leakage or line insulation resistance fault exists, or the electrical integrity is marginal, the subsea line insulation monitor device 9 can measure, display, record or transmit the measured value of the insulation resistance between any electrical conductor and ground. Further, other supplementary electrical parameters within the electrical distribution network can be sensed and output. These parameters may include impedance, voltage, current and power. Such measurements may help in diagnosing any sensed failure. As with the insulation resistance test, the output of such tests may be displayed locally, stored for future analysis or transmitted to a remote location, for example for real time analysis and fault diagnosis.

Further, Time Domain Reflectometry (TDR) functionality may be incorporated in order to help identify the precise location of the sensed fault. If incorporated, the TDR functionality could permit the identification of the fault location if the fault location is in close proximity to the device 9, and also if the fault location is at a long distance from the device 9. The TDR functionality may be optimized for distance interrogation through the use of variable or fixed pulse widths.

FIG. 4 is a simplified electrical block diagram illustrating the nature of the diagnostic unit 9a. An important characteristic of the diagnostic unit 9a is that the first and second connectors 8, 12 are connected to one another within the diagnostic unit 9a with the result that the device 11 can continue to be operated in substantially the normal fashion whilst testing is undertaken. As illustrated, the diagnostic unit 9a contains two separate line insulation monitoring circuits 16a, 16b to allow the independent sensing of the statuses of the equipment located both upstream and downstream of the device.

The diagnostic unit 9a conveniently contains its own internal power supply 18 operable to power the circuits located therein and, as illustrated, includes a display 20 operable to output signals indicative of the electrical integrity of the system being tested. As mentioned hereinbefore, however, there may be circumstances in which an internal display may not be required as the sensed parameters may simply be stored on an internal memory or transmitted directly to a remote location instead of being displayed. It will be appreciated that the precise nature of the circuitry within the diagnostic unit 9a is not of importance to the present invention and may take a wide range of forms. The arrangement illustrated in the block diagram of FIG. 4 is merely one example.

As outlined hereinbefore, by using subsea located or deployed line monitoring device, testing of equipment downstream of transformers or other galvanic isolation equipment is possible, such testing not being possible from a surface located device.

Although described as being connected in-line, with lines or equipment connected to both connectors of the device, it will be appreciated that this need not always be the case and the device could have equipment or a line connected to just the first connector thereof. Indeed, only one connector may be provided in some arrangements.

Although the description hereinbefore is of the use of the line monitoring device in conjunction with equipment used in the extraction of oil or natural gas from subsea locations, it will be appreciated that the invention is applicable to other applications. For example, it may be used in offshore electrical generation applications where the voltages concerned may be significantly higher than those experienced in the application described hereinbefore. Clearly, appropriate modifications to the components may be required in order to permit such use. Furthermore, its use is not restricted to distribution architectures, but rather it may be used in a wide range of other applications.

In the description hereinbefore reference is made to temporary installation of the device. It will be appreciated, however, that the device could be installed on a long term or permanent basis in some circumstances. For example, it could be a permanent retro-fit to an existing installation in which such diagnostic functionality was not previously provided.

A wide range of modifications and alterations of the arrangement described hereinbefore may be made without departing from the scope of the invention.

What is claimed is:

1. A subsea line monitoring device comprising a diagnostic unit adapted to be deployed on a long term or permanent basis, in use, in a subsea location and having a first connector, the diagnostic unit being operable, in use, to output a signal indicative of the integrity of a line or device connected on a long term or permanent basis to the first connector.

2. A subsea line monitoring device according to claim 1 and adapted to permit operation thereof in such a manner as to allow continued operation of the line or device to which the monitoring device is connected on a long term or permanent basis whilst the diagnostic unit monitors the integrity thereof.

3. A subsea line monitoring device according to claim 1, wherein the diagnostic unit further includes a second connector.

4. A subsea line monitoring device according to claim 3, wherein the diagnostic unit is further operable to output a signal indicative of the integrity of a line or device connected on a long term or permanent basis to the second connector.

5. A subsea line monitoring device according to claim 3, wherein the first and second connectors are electrically interconnected so as to permit the transmission of power and/or signals therebetween.

6. A subsea line monitoring device according to claim 3, further comprising a cable connecting the second connector to the diagnostic unit.

7. A subsea line monitoring device according to claim 1, wherein the diagnostic unit is provided with an internal power supply.

8. A subsea line monitoring device according to claim 6, wherein the internal power supply comprises a re-chargeable battery.

9. A subsea line monitoring device according to claim 1, wherein the diagnostic device includes a display wherein the output signal can be output.

10. A subsea line monitoring device according to claim 1, further comprising transmission means whereby the output signal can be transmitted to a remote location.

11. A subsea line monitoring device according to claim 10, wherein the transmission means is an electromagnetic or hydro-acoustic transmission means.

12. A subsea line monitoring device according to claim 1, further comprising memory means for storing the output signal.

13. A subsea line monitoring device according to claim 1, wherein the diagnostic unit is operable to sense an earth leakage or line insulation resistance status of the line(s) or device(s).

14. A subsea line monitoring device according to claim 1, wherein the diagnostic unit incorporates Time Domain Reflectometry (TDR) functionality in order to help identify the precise location of a sensed fault.

15. A subsea line monitoring device according to claim 1, wherein the diagnostic unit is operable to sense one or more electrical parameters of the line(s) or device(s).

16. A subsea line monitoring device according to claim 15, wherein the sensed electrical parameter is selected from a list comprising impedance, voltage, current and/or power.

* * * * *